United States Patent [19]

Malek-Khosravi

[11] Patent Number: 5,541,598
[45] Date of Patent: Jul. 30, 1996

[54] CURRENT CELL FOR CONVERTING A BINARY VALUE TO AN ANALOG VALUE

[75] Inventor: Behnam Malek-Khosravi, La Jolla, Calif.

[73] Assignee: Brooktree Corporation, San Diego, Calif.

[21] Appl. No.: 333,973

[22] Filed: Nov. 3, 1994

[51] Int. Cl.$^6$ ........................................... H03M 1/66
[52] U.S. Cl. .............................. 341/118; 341/144
[58] Field of Search .......................... 341/118, 119, 341/120, 121, 136, 144; 307/4, 3, 407

[56] References Cited

U.S. PATENT DOCUMENTS

| | | | |
|---|---|---|---|
| 4,088,905 | 5/1978 | Comer | 307/358 |
| 4,381,497 | 4/1983 | Lillis | 341/144 |
| 4,831,282 | 5/1989 | Colles | 307/443 |

*Primary Examiner*—Brian K. Young
*Attorney, Agent, or Firm*—Ellsworth R. Roston; Charles H. Schwartz

[57] ABSTRACT

A digital value represented by binary signals is converted to a corresponding analog value by three (3) current cells, preferably C-MOS p-type, in a digital-to-analog converter (DAC). The three (3) transistors, preferably disposed on an integrated circuit chip, comprise (a) an input switch transistor receiving a digital input signal at its gate, (b) an output transistor providing an output current at its drain and (c) a current bias transistor. The switch and output transistor sources and the bias transistor drain are common. The output transistor gate is biased by a substantially constant voltage. The bias transistor source receives a supply voltage through a bonding pad on an integrated circuit chip and a bond wire extending from the pad to a pin on the chip package lead frame. At low frequencies (e.g. 100 MHz), the wave shape of the output transistor drain current is flat. At increased frequencies (e.g. 225 MHz), the output current has a spike from a supply voltage spike induced in the bond wire as a result of different magnitudes in the bias transistor current when the switch transistor responds to binary signals.

31 Claims, 5 Drawing Sheets

CURRENT CELL FOR CONVERTING A BINARY VALUE TO AN ANALOG VALUE

This invention relates to a digital-to-analog converter. More particularly, the invention relates to a digital-to-analog converter which is provided on an integrated circuit chip, is simple in construction and operation and provides a substantially constant output even at frequencies as high as 225 megahertz.

Personal computers and work stations have been provided in recent years for indicating graphics and video information on a video monitor. For example, graphics information may be provided on the face of the video monitor (except for a window) and video information may be provided in the window. The graphics and video information is processed in digital form and is then converted to a corresponding analog representation for display on the video monitor.

The graphics and video information is provided in the form of pixels. Each pixel provides a separate spot of information on the video monitor. As the number of pixels on the video monitor is increased, the resolution (or fidelity) of the image on the video monitor is increased. The image on the video monitor is refreshed (or updated) a particular number of times (such as 60) every second. Thus, as the number of pixels on the screen is increased, the frequency of converting the digital information for the pixels to analog information is corresponding increased.

At a frequency of approximately one hundred megahertz (100 MHz), each digital conversion to an analog value occurs within approximately ten (10) nanoseconds. In this time period, it is important that the digital-to-analog conversion occurs with high fidelity. This means that the analog signal should rise almost instantaneously to the proper magnitude, remain at the constant magnitude through most of the conversion period and then decrease almost instantaneously to a zero value at the end of the conversion period.

If the analog signal takes too long to reach the proper value, the analog signal will not be at the proper value for a sufficiently long time to provide the viewer with a good visual impression of the pixel. If the analog signal for the pixel does not remain steady after reaching the proper value, the color and intensity of the image at the pixel will vary. It is also important that the current cell providing each binary conversion be relatively simple in construction and straightforward in operation, particularly since each integrated circuit chip generally requires a significant number of current cells to provide a conversion in view of the large number of pixels providing the image.

U.S. Pat. No. 4,831,282 issued to Joseph H. Colles on May 16, 1989, for a "CMOS INPUT CIRCUIT" and assigned of record to the assignee of record of this application discloses and claims a digital-analog converter with a number of significant advantages. The converter uses a current cell with only three (3) transistors, all of them preferably CMOS and all of them preferably of the p-type. At frequencies to approximately one hundred megahertz (100 Mhz), the current cell provides a fast response time to a binary input signal and provides a signal with a substantially constant magnitude after the signal reaches the proper magnitude.

The digital converter formed from such current cell also has certain important advantages. For example, it is monotonic. By "monotonic" is meant that digital information of progressively increasing value is converted to analog information of progressively increasing value without any decrease in the analog value as the digital value progressively increases. The converter also has high differential and integral linearities.

Integral non-linearities result from errors produced in a conversion between digital and analog values over a wide range of such values. Differential non-linearities result from errors produced in a conversion between digital and analog values over a relatively narrow range of such values. U.S. Pat. No. 4,831,282 has been held valid by the Court of Appeals for the Federal Circuit and has been allowed after a re-examination in the United States Patent Office.

In the current cell included in U.S. Pat. No. 4,831,282, an input switch transistor, an output transistor and a current bias transistor are provided. The sources of the input and output transistors and the drain of the current transistor have a common connection. A binary input signal having first and second logic levels is applied to the gate of the input switch transistor to make such transistor conductive upon the occurrence of the first logic level and non-conductive upon the occurrence of the second logic level.

The gate of the output transistor is biased with a substantially constant voltage to make the transistor conductive when the logic input to the switch transistor is driven positive. An output current flows through the drain of the output transistor when the output transistor is conductive. A supply voltage is applied to the source of the current bias transistor. A substantially constant voltage is applied to the gate of the current bias transistor to produce a flow of a substantially constant current through the current bias transistor and either the output or the switch transistor, dependent upon the states of the conductivity of the input switch transistor and the output transistor.

In the converter of U.S. Pat. No. 4,831,282, each of the transistors has distributed capacitances between its different terminals. The distributed capacitances between the terminals of the input switch transistor operate to enhance the crispness of the leading edge of the DAC output signal. Similarly, the distributed capacitances between the terminals of the input switch transistor operate to enhance the crispness of the trailing edge of the DAC output signal.

The above advantages apply to the operation of the current cell at frequencies below approximately one hundred megahertz (100 MHz). However, problems develop in the waveform at the DAC output when the frequency increases above approximately one hundred megahertz (100 MHz)) and particularly when the frequency increases to approximately two hundred and twenty five megahertz (225 MHz). The problems result from two (2) factors. One factor is that the bias transistor current increases as its drain to source voltage drop increases when the switch transistor input goes from a binary one (1) to a binary zero (0). Another factor is the inductance of the bonding wire from the DAC supply voltage pad to the package lead.

At high frequencies such as approximately two hundred and twenty five megahertz (225 MHz), the difference in the current in the bias transistor during the switching of the input switch transistor causes a voltage to be induced in the bonding wire, which may be considered to have a significant inductive reactance at the frequency of approximately two hundred and twenty five megahertz (225 MHz). This induced voltage changes the source voltage of the bias current transistor with respect to the gate of the transistor and causes a sharp spike to be produced at the leading edge of the output voltage pulse. This sharp DAC spike produces voltage spikes which, in turn, cause "sparkles" (or light spots) at various pixels. These are disturbing to the person viewing the image on the video monitor.

Considerable efforts have been made in the past to resolve the problems discussed in the previous paragraph. For example, efforts have been made to reduce the inductance of the bond wire. Efforts have also been made to increase the capacitance in the current cell, thereby decreasing the voltage changes produced by the inductance. In both of these cases, the efforts are directed toward reducing any changes in the supply voltage at the source of the current bias transistor at high frequencies as a result of the inductance in the bond wire.

A cascode transistor has also been included in the prior art in the current cell in series with the current bias transistor. The purpose of the cascode transistor has been to stabilize the voltage at the drain of the current bias transistor and consequently the drain current. However, the cascode transistor has required a voltage drop between its source and drain. This voltage has generally been in the range of one half to one (0.5–1.0 V.) volt. This has been satisfactory when the supply voltage has been plus five volts (+5 V). However, the supply voltage in many new systems involving CMOS transistors is now being reduced to plus three volts (+3 V). When plus three volts (+3 V) is used as the energizing voltage, voltage headroom is not available to accommodate the voltage drop in the cascode transistor. In view of this, a cascode transistor cannot be easily included in the current cells now being provided in integrated circuit chips operating at high frequencies (e.g. 225 MHz) and receiving an energizing voltage of +3 volts.

In one embodiment of the invention, a digital value represented by a plurality of binary input signals is converted to a corresponding analog value by a plurality of current cells each formed from three (3) transistors, preferably CMOS p-type, disposed on an integrated circuit chip and each responsive to one (1) of the binary input signals. The three (3) transistors comprise (a) an input switch transistor receiving a logic input signal at its gate, (b) an output transistor providing an output current at its drain and (c) a current bias transistor. The sources in the switch and output transistors and the bias transistor drain are common. The output transistor gate is biased by a substantially constant voltage.

The source in the current bias transistor receives a supply voltage through a bonding pad on an integrated circuit chip and a bond wire extending from the pad to a pin on the lead frame on the package housing the chip. At low frequencies (e.g. approximately 100 Mhz), the wave shape of the output transistor drain current is flat. At increased frequencies (e.g. approximately 225 MHz), the output current has a spike from a voltage induced in the bond wire as a result of changes in the bias transistor current when the cell is switched by a binary input signal.

A circuit compensates for the changes in the bias transistor currents thereby providing a flat output at the DAC output even at 225 MHz. The compensating circuit may include fourth and fifth transistors respectively corresponding to the current bias and input switch transistors to produce through the bond wire a compensating current when the DAC cell bias transistor current would otherwise drop as a result of the DAC cell switch transistor source being driven positive in voltage in response to a logic signal transition from a binary zero (0) to a binary one (1) applied to the input switch transistor gate.

Figure 5:
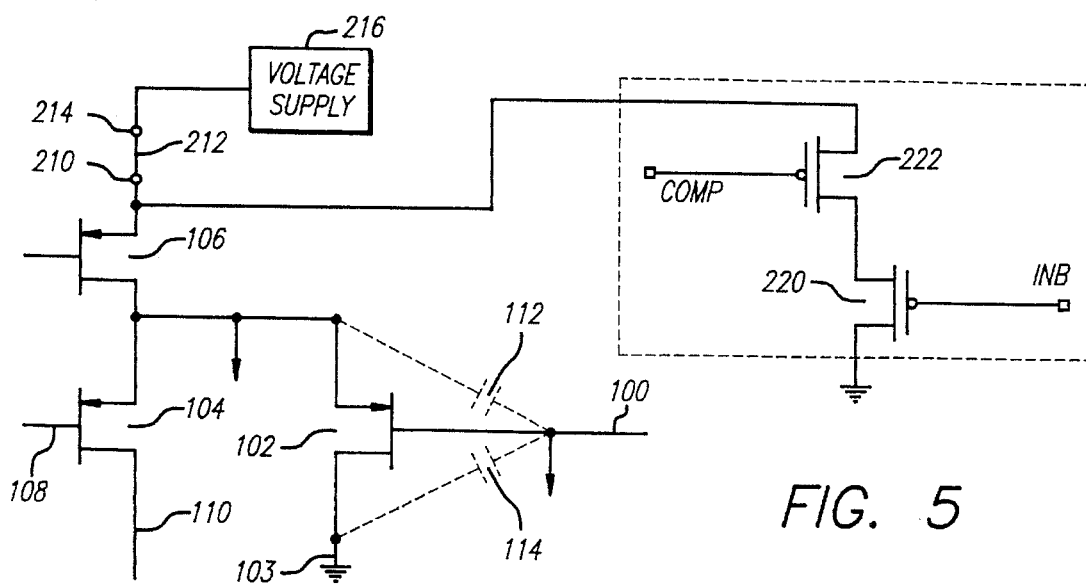
FIG. 5 is a circuit diagram of an improved current cell constituting one embodiment of the invention.
Figure 9:
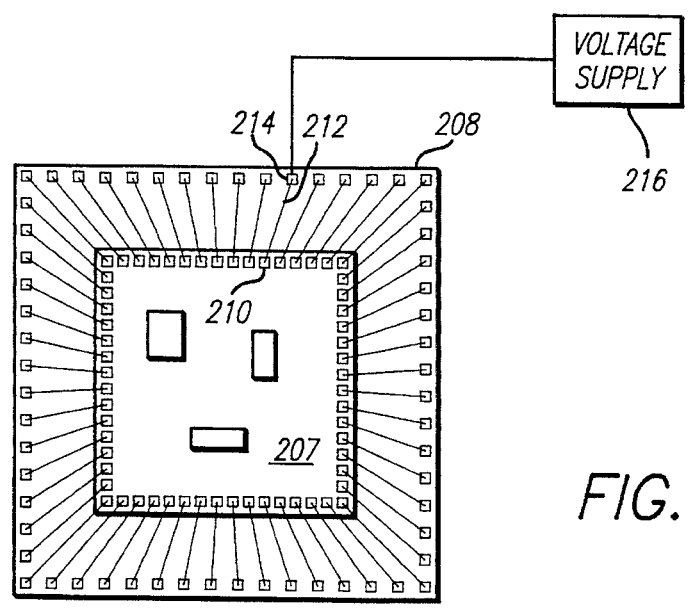
Figure 10:
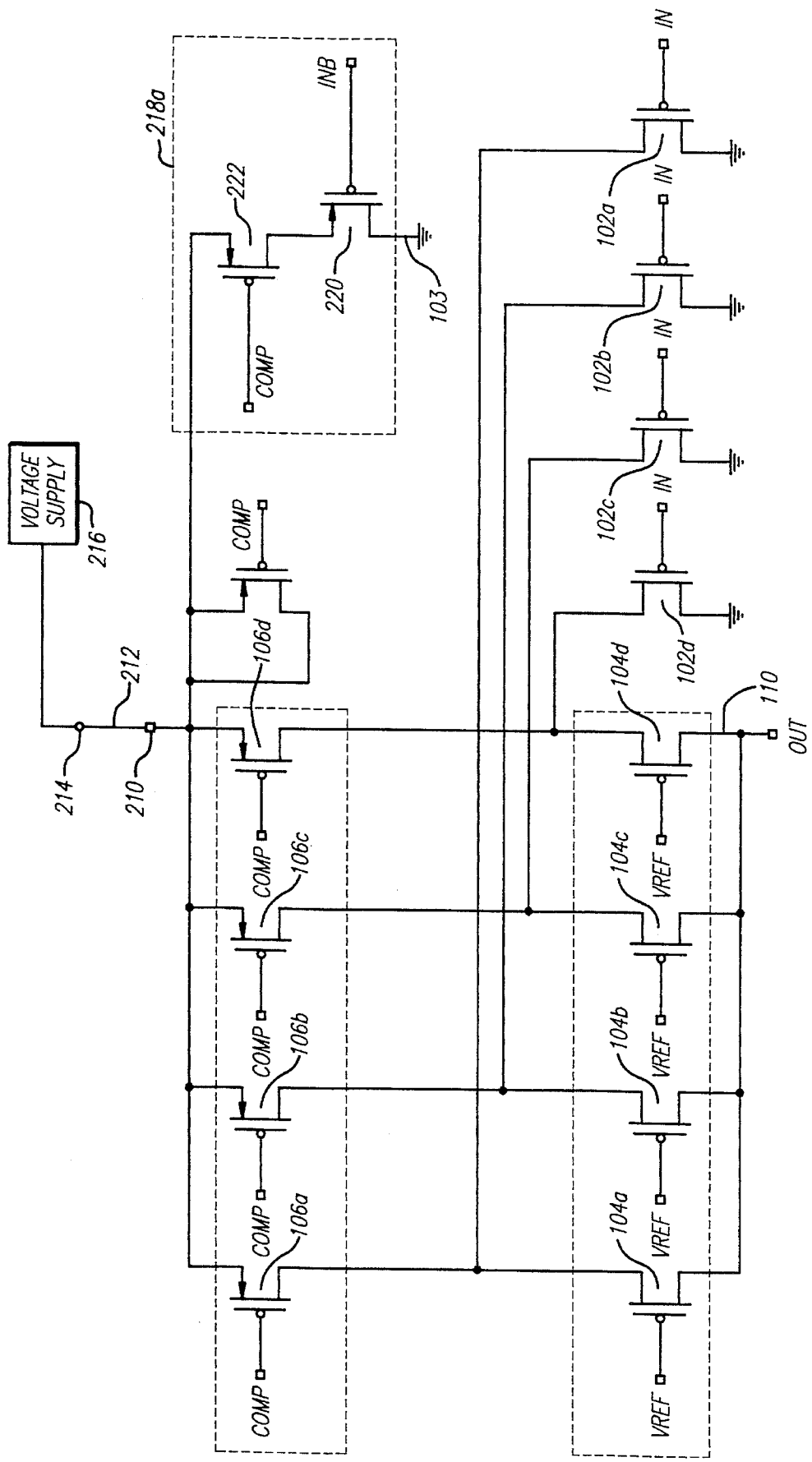

FIG. 9 is a schematic representation of (a) an integrated circuit chip disposed within a package and of bonding pads on the integrated circuit chip, (b) pins on the package housing the integrated circuit chip, including a pin for applying an energizing voltage to one of the transistors in the current cell and (c) bondwires extending from the pin on the package to the pads on the chips; and FIG. 10 is a circuit diagram of an improved digital-to-analog converter incorporating the features shown in FIG. 5.

Figure 1:
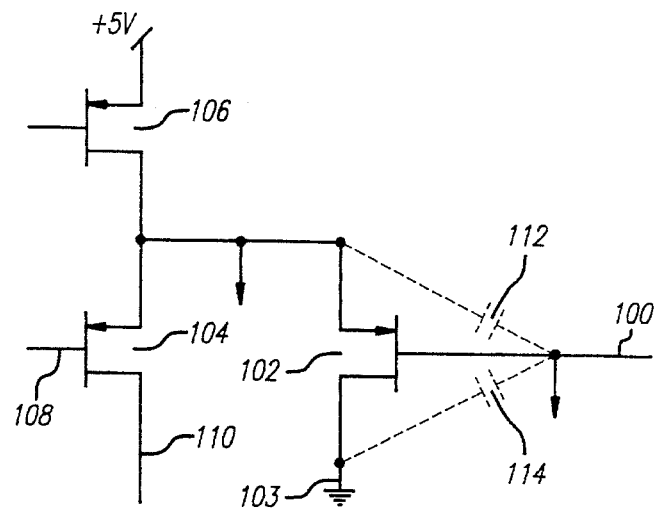
FIG. 1 is a circuit diagram of a current cell of the prior art for receiving a binary input signal and for producing an output current representative of such binary input signal.

FIG. 1 illustrates prior art circuitry for receiving binary input signals and for producing an output current representative of the binary input signals. The prior art circuitry of FIG. 1 is particularly adapted to be used in a digital-to-analog converter. The prior art circuitry shown in FIG. 1 includes an input line 100 for receiving the binary input signals. The input line 100 is connected to the gate of an input switch transistor 102 such as a MOS transistor of the p-type. The drain of the transistor 102 is connected through a line 103 to a reference potential such as an analog ground. The source of the transistor 102 is common with the source of an output transistor 104 and with the drain of a current bias transistor 106. The transistor 104 and 106 may be MOS transistors of the p-type.

Figure 3:
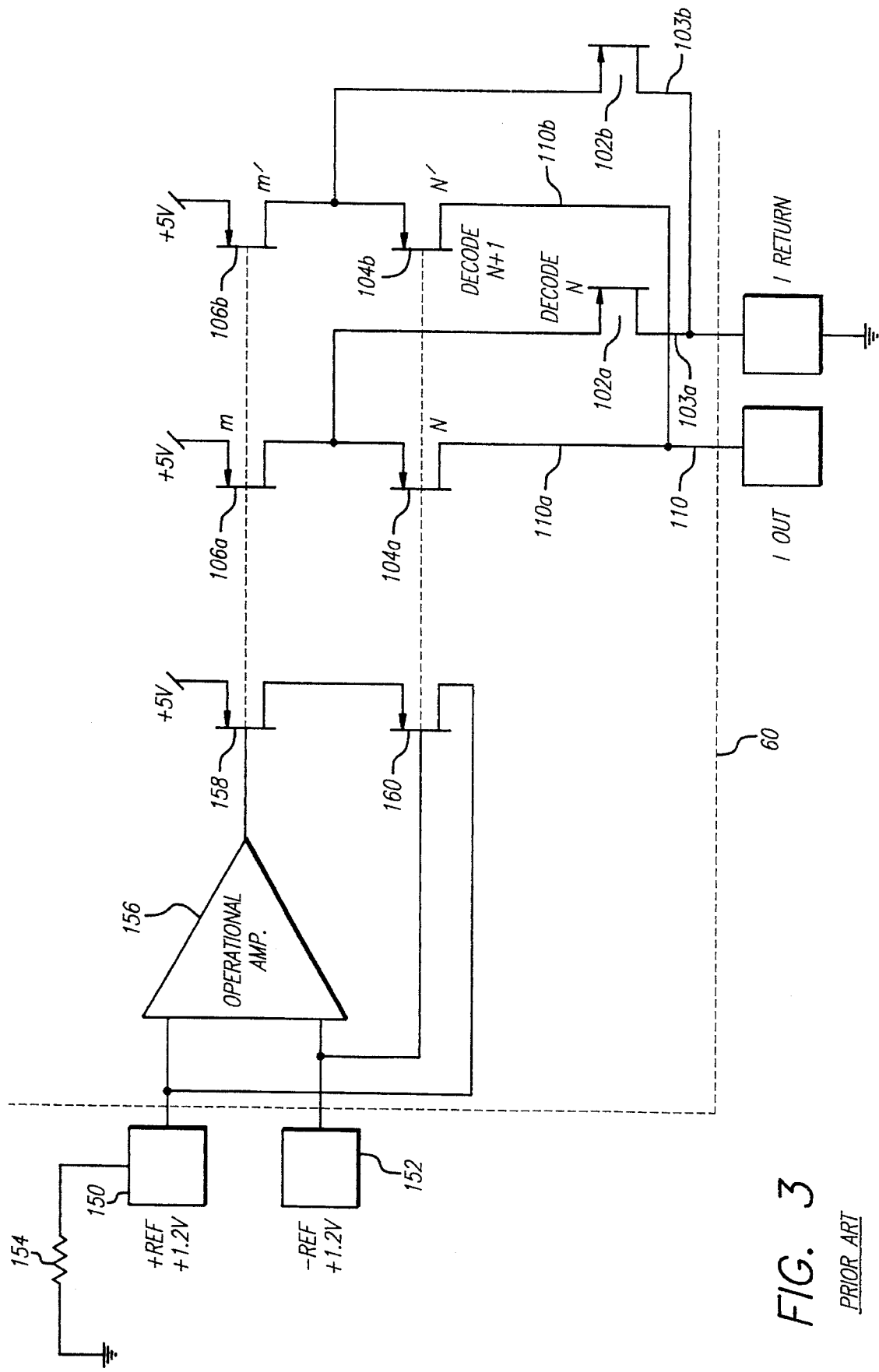
FIG. 3 is a schematic electrical diagram of a servo system which has been used in conjunction with the prior art circuitry shown in FIG. 1.

The source of the current bias transistor 106 receives a supply energizing potential such as approximately plus five volts (+5 V) or, more recently, plus three volts (+3 V). The gate of the transistor 106 receives a substantially constant bias voltage through a circuit which is shown in FIG. 3 and which will be described in detail subsequently. The gate of the output transistor 104 receives a suitable biasing voltage such as a voltage of approximately one and two tenths volts (+1.2 V) on a line 108. The output from the circuitry shown in FIG. 1 is produced on a line 110 which is connected to the drain of the transistor 104.

Distributed capacitances 112 (shown in broken lines in FIGS. 1) exist between the gate and the source of the input switch transistor 102 and distributed capacitances 114 (shown in broken lines in FIG. 1) exist between the gate and the drain of the transistor. These distributed capacitances are charged during the time that the input switch transistor 102 is nonconductive and they become discharged when the transistor 102 becomes conductive. These distributed capacitances are shown schematically. They constitute only two (2) of a number of distributed capacitances which may be considered to exist in the transistor 102. Distributed capacitances similar to those in the transistor 102 may be considered to exist in the transistor 104.

In output circuitry of the prior art before U.S. Pat. No. 4,831,282, the discharge of a distributed capacitance corresponding to the capacitance 112 occurs through a circuit including the drain and gate of an n-MOS transistor and the discharge of a distributed capacitor corresponding to the capacitance 114 occurs through a circuit including the gate and source of the n-MOS transistor. Thus, in the art prior to U.S. Pat. No. 4,831,282, such a transistor is an n-type rather than the p-type shown for the input switch transistor 102 in FIG. 1. As a result of the charge and discharge of such distributed capacitances, a current signal on the line 110 in FIG. 1 is produced in the n-type of transistor in the prior art with characteristics such as indicated at 116 in FIG. 2. This signal has a blip 118 which is produced as the gate is being driven positive on a change from a non-conductive state to a conductive state.

Similarly, the n-type of transistor corresponding in the prior art before U.S. Pat. No. 4,831,282 to the input switch transistor 102 produces a blip 119 when the gate is being driven negative as the transistor changes from a conductive to a non-conductive state. This results from the fact that the drain of the transistor (corresponding to the current bias transistor 106) in the prior art before U.S. Pat. No. 4,831,282 will swing over a larger voltage range than this invention requires. The switching circuits resulting from the parasitic capacitances corresponding to the capacitances 112 and 114 and the large voltage swings interfere with the operation of the output circuitry in the prior art before U.S. Pat. No. 4,831,282 because these switching currents flow in a direction opposite to the DAC output current.

Figure 2:
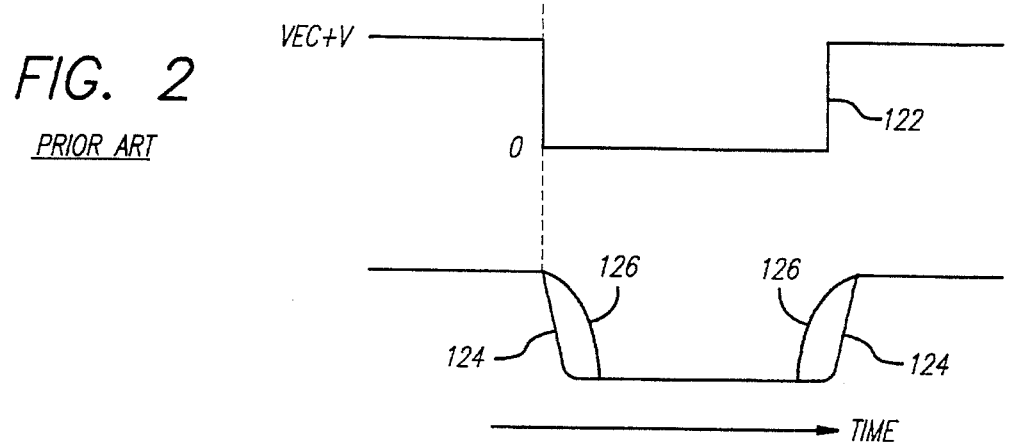
FIG. 2 illustrates waveforms of voltages and currents produced by the prior art circuitry shown in FIG. 1.

A signal 122 in FIG. 2 may be introduced to the line 100 (FIG. 1). This causes the input switch transistor 102 to become conductive. It conducts the current furnished by the current bias transistor 106. For frequencies below approximately one hundred megahertz (100 MHz), the current through the current bias transistor 106, and therefore through the input switch transistor 102, has a predetermined value because of the fixed bias introduced to the base of the transistor 106 through the circuitry shown in FIG. 3.

When the input switch transistor 102 becomes conductive in the prior art represented by U.S. Pat. No. 4,831,282, the charges in its parasitic capacitances 112 and 114 facilitate the flow of current through the transistor 102. The distributed capacitances 112 and 114 accordingly aid the switching of the output transistor 104 from the conductive state to the non-conductive state, thus increasing the switching speed of the transistor 104. Furthermore, the voltage swing at the drain of the current bias transistor 106 is reduced and this further increases the speed of switching the output transistor 104. This results in the current wave forms 124 (FIG. 3) in the line 110 in FIG. 1.

At the end of the signal on the line 100, the input switch transistor 102 becomes non-conductive and the output transistor 104 becomes conductive because of the bias voltage on the gate of the transistor 104. The resultant flow of current through the transistors 106 and 104 produces a rise in the voltage on the drain of the transistor 106 and on the source of the transistor 104. Since this rise in voltage is from a value of approximately plus one volt (+1 V) which is produced on the sources of the transistors 102 and 104 when the transistor 102 is conductive, the rise in voltage on the drain of the transistor 104 is quite fast.

The rise in the voltage on the drain of the output transistor 104 results in part from the fact that the voltage of approximately plus one volt (+1 V) on the source of the transistor 104 is quite close to the voltage of approximately one and two tenths volts (+1.2 V) on the gate of the transistor. This is particularly true since the corresponding voltage on the source of the n-type of transistor in the prior art such as the transistor 102 (p-type in this invention) is approximately zero volts (0 V). The production of a positive voltage on the source of the output transistor 104 is facilitated by the charging of the distributed capacitances 112 and 114 when the input switch transistor 102 becomes non-conductive. It is also facilitated by the discharge of the distributed capacitances in the output transistor 104.

As a result of the discharge of the distributed capacitances 112 and 114 through the input switch transistor 102 in the circuitry shown in FIG. 1 when the transistor 102 becomes conductive, the slope of the signal produced at the drain of the output transistor 104 is increased relative to the slope which would otherwise be produced if the distributed capacitors 112 and 114 did not discharge through the transistor 102. This may be seen from a comparison of the leading edge of the signal 124 (FIG. 2) produced on the line 110 by the circuitry shown in FIG. 1 in comparison to the leading edge of a signal 126 produced on the same line by the circuitry of the prior art before U.S. Pat. No. 4,831,282. Furthermore, as will be seen from the signal 124, no blips are produced in the leading and trailing edges of the signal.

The trailing edge of the output signal 124 produced by the circuitry shown in FIG. 1 is also sharper than the signal 126 produced by the circuitry of the prior art before U.S. Pat. No. 4,831,282. This results from the reduced time, in comparison to the prior art, for the voltage on the drain of the output transistor 104 to reach the proper value when the transistor 104 changes from a non-conductive state to a conductive state in the circuitry of this invention. The reduced time results in part from the discharge of the distributed capacitances in the output transistor 104 when the transistor becomes non-conductive.

As will be seen from the above discussion, the circuitry shown in FIG. 1 and described above has certain important advantages over the prior art before U.S. Pat. No. 4,831,282. It provides on the output line 110 the signal 124 at a frequency to approximately one hundred megahertz (100 MHz). It also provides the signal 124 with relatively sharp characteristics. This is in contrast to the prior art before U.S. Pat. No. 4,831,282 since such prior art provides the output signal 126 at a maximum frequency of approximately twenty-five megahertz (25 MHz) and with characteristics not nearly as sharp as those of the signal 124.

The above discussion has proceeded on the basis of charges and discharges in distributed capacitances. It will be appreciated, however, that directions of current flow to constitute charges and discharges in distributed capacitances is arbitrary and that charges in distributed capacitances may accordingly be considered as discharges and that discharges in distributed capacitances may be considered as charges. It will be appreciated that the distributed capacitances 112 and 114 are illustrative and that other distributed capacitances exist in the transistor 102 and that corresponding distributed capacitance exist in the transistor 104.

FIG. 3 illustrates prior art circuitry in U.S. Pat. No. 4,831,282 for regulating the biasing voltages introduced to the gates of the transistors 104 and 106. The prior art circuitry shown in FIG. 3 is disposed on an integrated circuit chip. The prior art circuitry shown in FIG. 3 includes a pad 150 on an integrated circuit chip 60 for providing a reference voltage such as approximately 1.2 volts. A resistance 154 is disposed electrically between the pad 150 and the reference potential such as the analog ground.

Input terminals of an operational amplifier 156 are respectively connected in the prior art of U.S. Pat. No. 4,831,282 to the pads 150 and 152. The output from the operational amplifier 156 is introduced to the gate of a transistor 158 such as a MOS transistor of the p-type. The source of the transistor 158 receives an energizing voltage such approximately plus five volts (+5 V) or, more recently, plus three volts (+3 V). The drain of the transistor 158 and a source of a transistor 160 are common. Connections are respectively made from the gate and the drain of the transistor 160 to the pads 152 and 150. The transistor 160 may be a CMOS transistor of the p-type.

The output of the operational amplifier 156 is introduced to the gates of the transistors 106a, 106b, etc. corresponding to the current bias transistor 106 in FIG. 1. Similarly, connections are made from the pad 152 to the gates of transistors 104a, 104b, etc. corresponding to the output transistor 104 in FIG. 1. Transistors 102a, 102b, etc. (corresponding to the transistor 102 in FIG. 10) are respectively connected to the transistors 104a and 106a and to current bias transistors 106a and 106b (corresponding to the current bias transistor 106 in FIG. 1) in a manner shown in FIG. 1. Lines 110a, 110b, etc. are connected to the line 110 also shown in FIG. 1. Lines 103a, 103b, etc. correspond to the line 103 in FIG. 1.

A substantially constant current flows in the amplifier 156 through a circuit including the pad 150, the resistance 154 and the reference potential such as the analog ground. This current is balanced in the operational amplifier 156 by the current produced in the amplifier as a result of the introduction of the voltage from the pad 152 to the amplifier. The current in the operational amplifier 156 biases the transistor 158 to a state of conductivity so that current flows through the transistors 158 and 160 to the pad 150 to correct for any imbalances between the current flowing through the operational amplifier 156 and the current flowing through the resistance 154. In this way, the bias introduced from the operational amplifier 156 to the gate of the transistor 158 is substantially constant.

The transistors 158 and 160 respectively correspond in characteristics to the current bias transistors 106a, 106b, etc., and the output transistors 104a, 104b, etc. As a result, the same current flows through the transistors 106a and 104a and through the transistors 106b and 104b as flows through the transistors 158 and 160. As a result, each of the circuits 106a and 104a, 106b and 104b, etc., provides a substantially constant current to the output line 110 in FIGS. 1 and 3 when a signal is introduced to the gate of the associated one of the input switch transistors 102a, 102b, etc., to make these transistors non-conductive. The magnitude of the cumulative current on the output line 110 indicates the analog value corresponding to the value of digital signals introduced to the gates of the input switch transistors 102a, 102b, etc. in FIG. 3. The analog indication represented by the current on the line 110 is monotonic and provides minimal integral and differential non-linearities.

Figure 4:
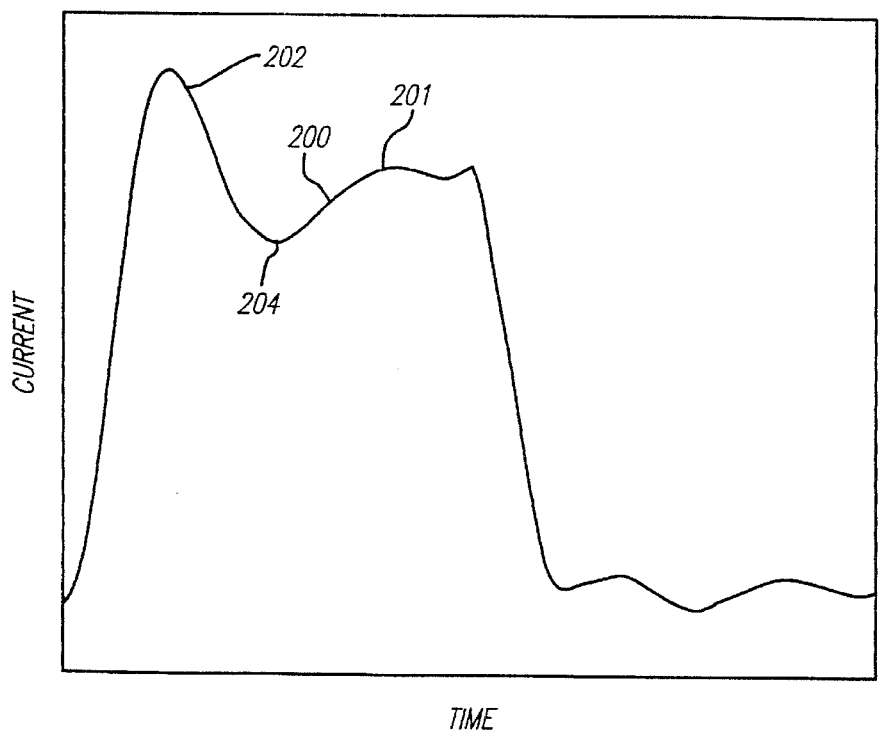
FIG. 4 is a waveform of the output current produced by the current cell shown in FIG. 1 at relatively high frequencies (e.g. 225 MHz) when the current cell has been regulated by the servo system shown in FIG. 3.

The circuitry shown in FIG. 1 and the servo system shown in FIG. 3 provide the output 124 in FIG. 2 at the drain of the output transistor 104 when the frequency is below approximately one hundred megahertz (100 MHz). However, at elevated frequencies such as approximately two hundred and twenty five megahertz (225 MHz), the output current on the drain of the output transistor 104 has a wave shape such as shown at 200 in FIG. 4. As will be seen, the waveform 200 has an upwardly-extending blip 202 which may have an amplitude in excess of approximately twenty percent (20%) of the steady state amplitude of the signal 124.

The blip is aggravated by a downwardly extending blip 204 which has an amplitude in excess of approximately ten percent (10%) of the amplitude of the signal 124. These blips significantly affect the stability in the output of the signal 124 and may even produce "sparkle" (or light spots) in the image. The stability of the output signal is particularly affected because the positive-going blip 202 and the negative-going blip 204 occur during approximately two third (⅔) of the duration time of the signal 124. As a result, the steady state amplitude 206 is relatively short compared to the total duration of the signal 200.

The positive-going blip 202 and the negative-going blip 204 occur at high frequencies (e.g. 225 Mhz) as a result of the disposition of an integrated circuit chip, generally indicated at 207 (FIG. 9), in a package 208 in a conventional manner. A plurality of bonding pads are provided in the package 208. One of these bonding pads is indicated at 210 in FIG. 9. This bonding pad is connected to the source of the current bias transistor 106. A bond wire 212 extends from the bonding pad 210 to a pin 214 on the package 208. The pin 214 is in turn connected to a voltage supply 216 which provides a voltage of plus five volts (+0.5 V.) for micron sizes for the circuitry on the chip 207 in excess of approximately eighth tenths of a micron (0.8 µ) or providing a voltage of approximately three volts (+3 V) for micron sizes of less than six tenths of a micron (0.6 µ). The bond wire 212 has an inductance whose deleterious effect on the operation of the current cell shown in FIG. 1 increases proportionately to increases in the frequency at which the current cell shown in FIG. 1 operates.

The deleterious effect of the inductance in the bond wire 212 may be seen from the following. The input transistor 102 passes a current when the input voltage on the gate of the transistor changes from a value of approximately five volts (+5 V.) to a value of zero volts (0 V.). The output transistor 104 becomes conductive when the gate of the input transistor 102 receives a voltage of approximately five volts (+5 V), thereby causing the bias voltage of +1.2 volts on the gate of the transistor 104 to produce a current through the transistor.

The current through the current bias transistor 106 (when the input switch transistor 102 is conductive) is greater than the current through the transistor 106 (when the output transistor 104 is conductive) because of the introduction of zero volts (0 V.) to the gate of the input switch transistor 102 during the conductivity of the transistor 102 as compared to the introduction of +1.2 volts to the gate of the output transistor 104 during the conductivity of the transistor 104. This difference in current through the current bias transistor 106 causes a voltage to be induced in the bond wire 212. This induced voltage produces variations in the voltage on the source of the current bias transistor 106 and causes variations in voltage to be produced on the drain of the output transistor 104 as indicated at 202 and 204 in FIG. 4 and as discussed above.

This invention includes the current cell shown in FIG. 1 and includes circuitry generally indicated at 218 in FIG. 5 for compensating for the difference in the current through the current transistor 106 when the output transistor 104 changes from a state of non-conductivity to a state of conductivity. The additional circuitry includes a pair of transistors 220 and 222 connected between the source of the current transistor 106 and the reference potential such as the analog ground 103. The transistors 220 and 222 may be CMOS transistors of the p-type and may respectively correspond in characteristics to the transistors 102 and 106.

The source and the gate of the transistor 222 are respectively common with the source and the gate of the current bias transistor 106. The drain of the transistor 222 and the source of the transistor 220 have a common connection. The drain of the transistor 220 is at the reference potential such as the analog ground 103. The gate of the transistor 220 receives an input signal which is the inverse of the input signal on the gate of the input switch transistor 102. In other words, the signal on the gate of the input switch transistor 102 is at the first logic level when the signal on the gate of the transistor 220 is at the second logic level and vice versa.

Figure 6:
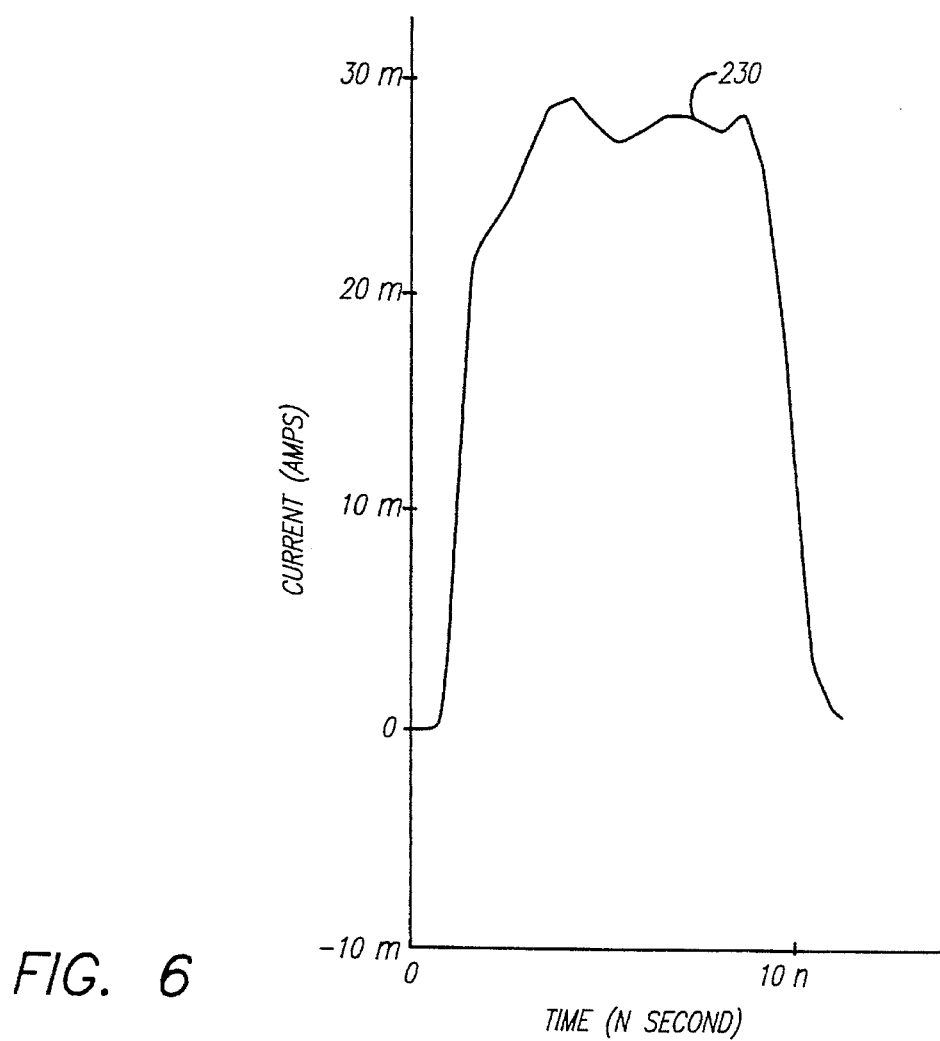
FIG. 6 is a wave form of the output current produced by the converter shown in FIG. 5 at the relatively high frequencies (e.g. 225 MHz) when the current cell has been regulated by the servo system shown in FIG. 3.

The compensating circuitry 218 is non-conductive when the input switch transistor 102 is conductive. During this time, a relatively large current flows through the bonding pad 210, the bond wire 212, the current bias transistor 106 and the input switch transistor 102. When the input switch transistor 102 becomes non-conductive, a current flows through the circuit 218 to compensate for the decrease in the current which is produced in the current bias transistor 106 when the output transistor 104 becomes conductive. As a result of the flow of the compensating current through the compensating circuit 218, the current through the bond wire 212 remains substantially constant. When the output transistor 104 changes to a state of conductivity, this prevents a voltage from being induced in the bond wire 212 when the current is switched from the input transistor 102 to the output transistor 104. As a result, a waveform such as illustrated at 230 in FIG. 6 is provided at the drain of the output transistor 104 when the output transistor becomes conductive. As will be seen, the waveform 230 of the signal on the drain of the output transistor 104 is substantially flat, particularly in comparison to the waveform shown in FIG. 4. The transistors 220 and 222 are provided with characteristics relative to the transistors 102 and 106 to provide only the compensating current.

Figure 7:
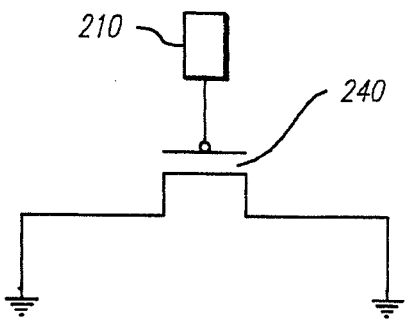
FIG. 7 is a schematic diagram illustrating circuitry for enhancing the operation of the improved current cell shown in FIG. 5.

FIG. 7 shows a modification for enhancing the smoothing action provided by the compensating circuit 218 shown in FIG. 5. In the modification shown in FIG. 7, a capacitor 240 is connected between the bonding pad 210 and the analog ground 103. This capacitor is sufficiently large to average, and thereby flatten, any change in the energizing voltage on the bonding pad 210 as a result of the voltage induced in the bond wire 212 from the changes in the current bias transistor 106. The averaging spreads the energy in any blips in the wave shape 230 in FIG. 6 over a large period of time and thus considerably flattens and reduces even further the amplitude of any change in the wave shape 230.

Figure 8A:
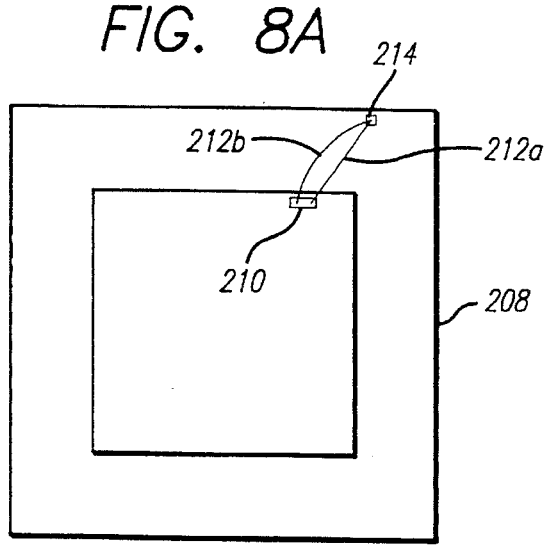
FIGS. 8a and 8b are schematic diagrams illustrating other circuitry for enhancing the operation of the improved current cell shown in FIG. 6.
Figure 8B:
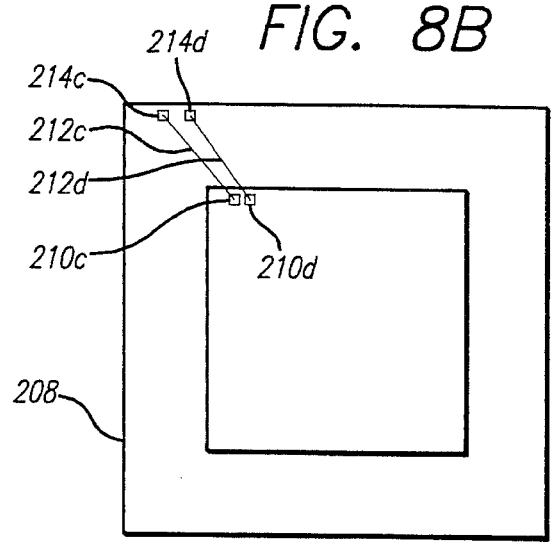

When the package 208 in FIG. 9 is a PGA type of package, the bonding pads such as the pad 210 are relatively large. This allows more than one (1) bond wire 212 (212*a* and 212*b* in FIG. 8A) to extend between the bonding pad 210 and the pin 214 on the package 208 to reduce the effective inductance of the bond wire connections between the bonding pad and the pin. When the package 200 is a flat pack type of package, a bond wire 212*c* may extend between a bonding pad 210*c* and a pin 214*c* and another bond wire 212*d* may extend between a bonding pad 210*d* and a pin 214*d* to provide a reference such as an analog ground. This alternate arrangement tends to produce offsetting magnetic fluxes in adjacent bond wires such as the bond wires 212*a* and 212*b* to reduce the overall inductive effect in the bond wires.

The current cell shown in FIG. 1, the associated servo circuitry shown in FIG. 3 and the compensating circuitry 218 shown in FIG. 5 have certain important advantages. They provide an output current with a substantially flat response (230 in FIG. 6) through frequencies as high as two hundred and twenty five megahertz (225 MHz) when the circuitry on an integrated circuit chip is fabricated with micron technology of six tenths of a micron or less (0.6 μ). The substantially flat response 230 is further advantageous in that it rises, as shown in FIG. 6, almost instantaneously to the full value without any appreciable blip, remains at this full value for almost the full duration of the output pulse and then falls almost instantaneously to a zero (0) value. The circuitry constituting this invention is also advantageous in that it can operate satisfactorily with a voltage as small as plus three volts (+3 V) on the source of the current transistor 106.

FIG. 10 illustrates a modification of the invention shown in FIG. 5. In FIG. 10, one (1) compensating circuit 218*a* is shown. However, it may constitute a compensating circuit for an array of four (4) similar current cells. An array of current cells formed by the transistors 102*a*, 104*a* and 106*a* may actually constitute eight (8) different current cells. The array of current cells formed by the transistors 102*b*, 104*b* and 106*b* may constitute four (4) current cells. Each of the arrays of current cells formed by the transistors 102*c*, 104*c* and 106*c* and by the transistors 102*d*, 104*d* and 106*d* may constitute two (2) current cells.

The transistors 102*a*, 102*b*, 102*c*, 102*d* and 220 may have identical characteristics; the transistors 104, 104*b*, 104*c* and 104*d* may have identical characteristics; and the transistors 106*a*, 106*b*, 106*c*, 106*d* and 222 may have identical characteristics. As will be seen, the embodiment shown in FIG. 10 constitutes a compromise since one compensating circuit 218*a* formed from an array of four (4) compensating circuits provides a compensation for sixteen (16) current cells.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

What is claimed is:

1. In combination for providing an output current in accordance with an input signal having first and second logic levels, first, second and third transistors each having first, second and third terminals, the first terminals of the first and second transistors and the third terminal of the third transistor having a common connection, means for introducing the input signal to the second terminal of the first transistor, means for introducing a substantially constant voltage to the second terminal of the second transistor to bias the second transistor to a state of conductivity, means for producing a current through the third transistor for the flow of the current through an individual one of the first and second transistors in accordance with an individual one of the first and second logic levels in the input signal, means for applying a supply voltage to the first electrode of the third transistor, there being a difference in currents through the third transistor for the first and second logic levels of the input signal, and means operatively coupled to the supply voltage means for compensating for the difference in the currents through the third transistor for the first and second logic levels of the input signal.

2. In a combination as set forth in claim 1, the first transistor being operative to provide a current through the first transistor upon the occurrence of the first logic level in the input signal and to prevent the provision of such a current through the first transistor upon the occurrence of the second logic level in the input signal, and the compensating means being operative upon the occurrence of the second logic level in the input signal to produce a current through the compensating means to compensate for the current previously produced in the first transistor.

3. In a combination as set forth in claim 1, the first, second and third transistors constituting p-transistors of the CMOS type.

4. In a combination as set forth in claim 1, the third terminal of the second transistor providing an output current upon the occurrence of the second logic level in the input signal.

5. In a combination as set forth in claim 1, the third terminal of the first transistor having a reference potential, the compensating means being connected between the supply voltage means and the reference potential.

6. In a combination as set forth in claim 6, the first, second and third transistors constituting CMOS transistors of the p-type.

7. In combination for providing an output current in accordance with an input signal having first and second logic levels, first, second and third transistors, the first and second transistors and the third transistor having a common connection, means for applying the input signal to the first transistor to provide the first transistor with a state of conductivity upon the occurrence of the first logic level in the input signal and to provide the first transistor with a state of non-conductivity upon the occurrence of the second logic level in the input signal, means for applying a substantially constant voltage to the second transistor to bias the second transistor to obtain a conductivity in the second transistor when the first transistor becomes non-conductive, means for providing a current through the third transistor for a flow of current through either the first transistor or the second transistor in accordance with the logic level of the input signal, means for applying a supply voltage to the third transistor, the energizing voltage being variable upon a change of the conductivity from the first transistor to the second transistor, and means for compensating for the variations in the supply voltage upon a change of the conductivity from the first transistor to the second transistor.

8. In a combination as set forth in claim 7, the compensating means having states of conductivity and non-conductivity and being connected to the energizing voltage means to become conductive upon the occurrence of a state of non-conductivity in the first transistor, and to become non-conductive upon the occurrence of a state conductivity in the first transistor, to compensate for the change in the supply voltage when the first transistor becomes non-conductive and the second transistor becomes conductive.

9. In a combination as set forth in claim 8, the compensating means including fourth and fifth transistors respectively having connections corresponding to the connections of the first and third transistors.

10. In a combination as set forth in claim 7, the first and second transistors having substantially equal characteristics.

11. In a combination as set forth in claim 9, the fourth and fifth transistors having characteristics relative to the first and second transistors for compensating for differences in the current in the third transistor when the first and second transistors are respectively conductive.

12. In a combination as set forth in claim 11, the first, second, third, fourth and fifth transistors being CMOS transistors of the p-type.

13. In combination for providing an output current in accordance with an input signal having first and second logic levels, first means for providing the input signal, second means including a first transistor for receiving the input signal and for providing a state of conductivity in the first transistor upon the occurrence of the first logic level in the input signal and for providing a state of non-conductivity in the first transistor upon the occurrence of the second logic level in the input signal, third means including a second transistor connected to the first transistor to become conductive upon a state of non-conductivity in the first transistor and to become non-conductive upon a state of conductivity in the first transistor and to provide the output current upon the state of conductivity in the second transistor, fourth means including a third transistor connected to the first and second transistors to provide a current through the conductive one of the first and second transistors, the fourth means including the third transistor providing a different magnitude of current through the first transistor than through the second transistor, and fifth means for compensating for the change in the current in the third transistor when the first transistor changes between the conductive and non-conductive states.

14. In a combination as set forth in claim 13, the fifth means including fourth and fifth transistors connected to each other to provide a current flow compensating for the change in the current flow through the third transistor as a result of a change in the first means between the first and second logic levels.

15. In a combination as set forth in claim 13, the first and third transistors being connected in a series relationship and the fourth and fifth transistors being connected in a series relationship.

16. In a combination as set forth in claim 15, the first, second, third, fourth and fifth transistors being CMOS transistors of the p-type.

17. In a combination as set forth in claim 16, the first and third transistors respectively having the characteristics relative to the fourth and fifth transistors to provide for a compensating current in the fourth and fifth transistors corresponding to the difference in the currents in the third transistor when the first and second transistors are respectively conductive.

18. In combination for providing an output current in accordance with an input signal having first and second logic levels, a package having a plurality of pins, an integrated circuit chip disposed within the bonding pads and having a plurality of bonding pads, bonding wires extending between individual ones of the bonding pads in the plurality and individual ones of the pins in the plurality, a current cell on the integrated circuit chip, the current cell having first, second and third transistors, means including an individual one of the pins in the plurality and an individual one of the bonding pads in the plurality and a bond wire between the individual one of the pins and the individual one of the bonding pads for providing a supply voltage to the individual ones of the bonding pads in the plurality, the third transistor being connected to the individual one of the bonding pads in the plurality and being biased to produce a current, the first transistor being connected to the third transistor and being responsive to the input signal to produce a current having a particular magnitude, dependent upon the logic level of the input signal, through the third and first transistors, the second transistor being connected to the first and third transistors and being biased to produce a current through the third and second transistors dependent upon the state of conductivity of the first transistor, and means for compensating for any difference in the magnitudes of the currents in the third transistor when individual ones of the first and second transistors become conductive.

19. In a combination as set forth in claim 18, means responsive to the current from the second transistor for providing an output in accordance with such current.

20. In a combination as set forth in claim 18, the compensating means including means for producing a current through the individual one of the bonding pads and the individual one of the bond wires when the first transistor is non-conductive, corresponding to the current through the individual one of the bonding pads and the individual one of the bond wires when the first transistor is conductive.

21. In a combination as set forth in claim 18, the compensating means being constructed to minimize any inductive effect in the individual one of the bonding pads and the individual one of the bond wires as a result of any differences in the magnitude of the current in the third transistor when the individual ones of the first and second transistors become conductive.

22. In a combination as set forth in claim 21, the first and third transistors being connected in a first circuit with the energizing means and the individual one of the bonding pads and the individual one of the bond wires to pass a current through this circuit when the first transistor becomes conductive, the second and third transistors being connected in a second circuit with the supply voltage means and the individual one of the bonding pads and the individual one of the bond wires to pass a current through this circuit when the second transistor becomes conductive, the compensating means including fourth and fifth transistors connected in a circuit with the energizing means including the individual one of the bonding pads and the individual one of the bond wires to pass a current through this circuit when the first transistor becomes non-conductive.

23. In a combination as set forth in claim 22, means responsive to the current from the second transistor for providing an output in accordance with such current, the fifth transistor being biased to produce a current in the third circuit, the fourth transistor being connected to the fifth transistor and being responsive to the complement of the input signal applied to the first transistor to produce the current through the third circuit when the first transistor is non-conductive.

24. In combination for providing an output current in accordance with an input signal having first and second logic levels, a bonding pad for providing an energizing voltage, a bond wire extending from the bonding pad, a first transistor, first means for introducing the input voltage to the first transistor to obtain a conductivity or a non-conductivity of the first transistor in accordance with the logic level of the input voltage, a second transistor connected to the first transistor, second means for biasing the second transistor to become conductive upon the occurrence of a state of non-conductivity in the first transistor, third means for obtaining an output from the second transistor upon a state of conductivity in the second transistor, a third transistor connected to the first and second transistors and to the bonding pad to produce a current through the third transistor and the conductive one of the first and second transistors, and fourth means for minimizing any inductive effects from the bond wire as a result of changes in the current through the third transistor when the first transistor changes between the conductive and non-conductive states.

25. In a combination as set forth in claim 24 wherein the fourth means includes means for compensating for any induction of a voltage in the bond wire as a result of changes in the current in the third transistor when the first transistor changes between the conductive and non-conductive states.

26. In a combination as set forth in claim 24 wherein the fourth means includes fourth and fifth transistors defining a circuit with the bonding pad and the bond wire to compensate for any induction of a voltage in the bond wire as a result of changes in the current in the third transistor when the first transistor changes between the conductive and non-conductive states.

27. In a combination as set forth in claim 24 wherein supply voltage means are connected to the bond wire and wherein the fourth means includes a capacitor connected to the supply voltage means to reduce the inductive effects in the bond wire as a result of changes in the current in the third transistor when the first transistor changes between the conductive and non-conductive states.

28. In combination for producing an output current in accordance with an input signal having first and second logic levels, a first MOS transistor, means for introducing a substantially constant reference voltage to the first MOS transistor, means for introducing the binary input signal to the first MOS transistor to obtain a conductivity of the first MOS transistor for a particular one of the first and second logic levels and to obtain a non-conductivity of the first MOS transistor for the other one of the first and second logic levels, means including a second MOS transistor connected to the first MOS transistor to become non-conductive upon a state of conductivity in the first MOS transistor and to become conductive upon a state of non-conductivity in the first transistor, means for introducing a substantially constant bias voltage to the second MOS transistor to produce a conductivity in the second transistor when the first transistor becomes non-conductive, means including a third MOS transistor operatively coupled to the first and second MOS transistors and responsive to the substantially constant bias introduced to the second MOS transistor for providing for a flow of current through the second MOS transistor, and no flow of current through the first MOS transistor, in accordance with the second logic level in the input signal and for providing for a flow of current through the first MOS transistor, and no flow of current through the second MOS transistor, in accordance with the first logic level in the input signal, there being distributed capacitances in each of the first and second MOS transistors, the distributed capacitances in each such transistor being charged during the state of non-conductivity in such transistor, the first and second MOS transistors being connected to provide for the control in the operation of each such transistor in accordance with the state of operation of the other MOS transistor and the charge in the distributed capacitances of each such transistor, the transition from the state of non-conductivity to the state of conductivity in each of the first and second MOS transistors being expedited by the charging of the distributed capacitances in the other transistor, and means connected to compensate for any differences between the magnitudes of the currents in the first and second MOS transistors when the individual ones of the first and second transistors become conductive.

29. In a combination as set forth in claim 28, the means for providing the flow of current through the first and second MOS transistors during the respective conductivities of the first and second MOS transistors including a third MOS transistor and means for introducing a substantially bias voltage to the third MOS transistor to produce a flow of current through the third MOS transistor and the conductive one of the first and second MOS transistors, the first, second and third MOS transistors being disposed on an integrated circuit chip, a package for the integrated circuit chip, a bonding pad on the integrated circuit chip, a pin on the package, a bond wire extending between the bonding pad and the pin, the bond wire having an inductance, and means for applying a supply voltage to the pin to obtain an energizing of the MOS transistors on the chip, the compensating means being operative to minimize the effects of the inductance in the bond wire on the production of the output current as a result of changes in the current in the third MOS transistor when the first MOS transistor changes from a conductive state to a non-conductive state.

30. In a combination as set forth in claim 28 wherein the change in the operation of the second MOS transistor from a state of conductivity to a state of non-conductivity is expedited by the discharge of the distributed capacitances in the first MOS transistor when the first MOS transistor becomes conductive and wherein the compensating means produces a current in the bonding pad and the bond wire upon a non-conductivity in the first MOS transistor to compensate for a change in the current in the bonding pad and the bond wire relative to the current in the bonding pad and the bond wire when the first MOS transistor is conductive.

31. In a combination as set forth in claim 29, servo means including fourth and fifth MOS transistors operatively coupled respectively to the second and third MOS transistors for providing a closed loop path for regulating the flow of current through the fourth and fifth transistors and through the third transistor, the first, second, third, fourth and fifth MOS transistors being of the p-type, the servo means being operative to regulate the current through the compensating means.

* * * * *